United States Patent
Nanbu et al.

(10) Patent No.: US 12,144,239 B2
(45) Date of Patent: Nov. 12, 2024

(54) SUBSTRATE FOR FLEXIBLE DEVICE

(71) Applicant: TOYO SEIKAN GROUP HOLDINGS, LTD., Tokyo (JP)

(72) Inventors: Kouji Nanbu, Kudamatsu (JP); Toshihiko Miyazaki, Osaka (JP); Hirohisa Masuda, Osaka (JP); Hiroshi Shimomura, Osaka (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 800 days.

(21) Appl. No.: 17/274,030

(22) PCT Filed: Aug. 29, 2019

(86) PCT No.: PCT/JP2019/033852
§ 371 (c)(1),
(2) Date: Mar. 5, 2021

(87) PCT Pub. No.: WO2020/054441
PCT Pub. Date: Mar. 19, 2020

(65) Prior Publication Data
US 2021/0343953 A1    Nov. 4, 2021

(30) Foreign Application Priority Data
Sep. 12, 2018 (JP) .................... 2018-170589

(51) Int. Cl.
*H01L 51/00* (2006.01)
*C03C 3/066* (2006.01)
(Continued)

(52) U.S. Cl.
CPC ............ *H10K 77/111* (2023.02); *C03C 3/066* (2013.01); *C03C 3/122* (2013.01); *C03C 3/14* (2013.01);
(Continued)

(58) Field of Classification Search
CPC ....... H01K 77/111; C03C 3/066; C03C 3/122; C03C 3/14; C03C 8/04; C03C 8/16;
(Continued)

(56) References Cited

U.S. PATENT DOCUMENTS 4,472,223 A    9/1984  Bowsky
4,936,290 A *  6/1990  Smith .................... F24S 23/77
                                              126/696
(Continued)

FOREIGN PATENT DOCUMENTS

EP    2 925 089 A1    9/2015
GB    2 094 838 A     9/1982
(Continued)

OTHER PUBLICATIONS

Extended European Search Report dated Dec. 8, 2021, issued by the European Patent Office in corresponding application No. 19861020.6.
(Continued)

*Primary Examiner* — Michael E. La Villa
(74) *Attorney, Agent, or Firm* — Sughrue Mion, PLLC

(57) ABSTRACT

A substrate for flexible device, including a stainless steel sheet, an oxide layer formed on a surface of the stainless steel sheet, and a glass layer of electrically-insulating bismuth-based glass formed in a form of layer on the surface of the oxide layer. Also disclosed is a sheet for flexible device, including a stainless steel sheet, and an oxide layer on a surface of the stainless steel sheet, the oxide layer having a thickness of not less than 30 nm.

5 Claims, 1 Drawing Sheet

(51) Int. Cl.
| | |
|---|---|
| *C03C 3/12* | (2006.01) |
| *C03C 3/14* | (2006.01) |
| *C03C 8/04* | (2006.01) |
| *C03C 8/16* | (2006.01) |
| *C23C 8/14* | (2006.01) |
| *C23C 24/08* | (2006.01) |
| *C23C 26/00* | (2006.01) |
| *C23C 28/00* | (2006.01) |
| *C23C 28/04* | (2006.01) |
| *C23D 5/00* | (2006.01) |
| *G09F 9/30* | (2006.01) |
| *H10K 77/10* | (2023.01) |
| *H10K 102/00* | (2023.01) |

(52) U.S. Cl.
CPC .............. *C03C 8/04* (2013.01); *C03C 8/16* (2013.01); *C23C 8/14* (2013.01); *C23C 24/08* (2013.01); *C23C 26/00* (2013.01); *C23C 28/04* (2013.01); *C23C 28/042* (2013.01); *C23C 28/30* (2013.01); *C23C 28/32* (2013.01); *C23C 28/321* (2013.01); *C23C 28/3215* (2013.01); *C23C 28/322* (2013.01); *C23C 28/34* (2013.01); *C23C 28/345* (2013.01); *C23C 28/3455* (2013.01); *C23D 5/00* (2013.01); *G09F 9/301* (2013.01); *H10K 2102/311* (2023.02); *Y02E 10/549* (2013.01); *Y10T 428/12438* (2015.01); *Y10T 428/12583* (2015.01); *Y10T 428/1259* (2015.01); *Y10T 428/12597* (2015.01); *Y10T 428/12604* (2015.01); *Y10T 428/12611* (2015.01); *Y10T 428/12618* (2015.01); *Y10T 428/1266* (2015.01); *Y10T 428/12667* (2015.01); *Y10T 428/12847* (2015.01); *Y10T 428/12854* (2015.01); *Y10T 428/12979* (2015.01); *Y10T 428/24942* (2015.01); *Y10T 428/2495* (2015.01); *Y10T 428/24959* (2015.01); *Y10T 428/24967* (2015.01); *Y10T 428/24975* (2015.01); *Y10T 428/26* (2015.01); *Y10T 428/263* (2015.01); *Y10T 428/264* (2015.01); *Y10T 428/265* (2015.01)

(58) Field of Classification Search
CPC ........... C23C 8/14; C23C 24/08; C23C 26/00; C23C 28/04; C23C 28/30; C23C 28/32; C23C 28/321; C23C 28/322; C23C 28/34; C23C 28/345; C23C 28/042; C23C 28/3215; C23C 28/2455; C23D 5/50; G09F 9/301; H10K 2102/311; Y02E 10/549; Y10T 428/12979; Y10T 428/12583; Y10T 428/1259; Y10T 428/12597; Y10T 428/12604; Y10T 428/12611; Y10T 428/12618; Y10T 428/1266; Y10T 428/12667; Y10T 428/12438; Y10T 428/12847; Y10T 428/12854; Y10T 428/24942; Y10T 428/2495; Y10T 428/24959; Y10T 428/24967; Y10T 428/24975; Y10T 428/263; Y10T 428/264; Y10T 428/265; Y10T 428/26

See application file for complete search history.

(56) References Cited

U.S. PATENT DOCUMENTS

| | | | |
|---|---|---|---|
| 11,414,762 B2 * | 8/2022 | Nanbu | ............ C25D 5/50 |
| 2005/0189525 A1 | 9/2005 | Kuckelkorn et al. | |
| 2010/0119740 A1 | 5/2010 | Bettger et al. | |
| 2012/0006395 A1 | 1/2012 | Boussaad et al. | |
| 2012/0187399 A1 | 7/2012 | Fukuda et al. | |
| 2012/0234391 A1 | 9/2012 | Boussaad et al. | |
| 2013/0090226 A1 * | 4/2013 | Hamada | ............ H01J 5/04 501/52 |
| 2019/0088893 A1 | 3/2019 | Miyazaki et al. | |

FOREIGN PATENT DOCUMENTS

| | | |
|---|---|---|
| GB | 2 540 384 A | 1/2017 |
| JP | 2004-171806 A | 6/2004 |
| JP | 2006-080370 A | 3/2006 |
| JP | 2011-097007 A | 5/2011 |
| JP | 2014-107053 A | 6/2014 |
| JP | 2015-071513 A | 4/2015 |
| WO | 2016/001971 A1 | 1/2016 |
| WO | 2017/170038 A1 | 10/2017 |

OTHER PUBLICATIONS

"Steel-stainless steel not losing to rust (part 1)", Nippon Steel Monthly, Nov. 2005, pp. 9-12.
International Search Report of PCT/JP2019/033852 dated Nov. 12, 2019 [PCT/ISA/210].

* cited by examiner

SUBSTRATE FOR FLEXIBLE DEVICE

CROSS REFERENCE TO RELATED APPLICATIONS

This application is a National Stage of International Application No. PCT/JP2019/033852, filed Aug. 29, 2019, claiming priority to Japanese Patent Application No. 2018-170589, filed Sep. 12, 2018.

TECHNICAL FIELD

The present invention relates to a substrate for flexible device. More specifically, the present invention relates to a substrate for flexible device, which is excellent in antirust property, moisture barrier property, bending strength and adhesion of an insulating layer, therefore, used preferably to an organic EL application.

BACKGROUND ART

A substrate for flexible device used in an organic EL lighting, an organic EL display, an organic thin-film solar cell, an IC print circuit, electronic paper or the like is required to have barrier properties such as a moisture barrier property and a gas barrier property, and further smoothness and insulation. In addition, the substrate is required to have excellent flexibility (bending strength) so that it can be applied to a curved surface or can be manufactured in a roll-to-roll process.

Patent document 1 below discloses a structure of an organic EL device prepared by coating a transparent electroconductive layer, an organic light-emitting medium layer and a cathode layer in this order on a plastic film sheet, and a metal foil is further laminated thereon via an adhesive layer. However, the plastic film sheet is unsatisfactory from the viewpoint of moisture barrier property and heat resistance.

Patent document 2 below discloses a substrate for flexible device, provided with a flattening layer of a polyimide resin on a stainless steel sheet. However, it cannot provide a satisfactory moisture barrier property due to the high water-absorbing property of the polyimide resin.

Patent document 3 below discloses a flexible solar cell sheet prepared by forming a film of silica-based glass on a stainless steel sheet. However, typical silica-based glass has a thermal expansion coefficient smaller than that of stainless steel, and thus, it lacks adhesion to the stainless steel sheet. Another problem of the silica-based glass is that it is vulnerable to bending and impact.

For solving these problems, the present inventors propose in Patent document 4 a metal substrate for flexible device. The substrate is prepared by forming a nickel plating layer on a surface of a metal sheet, and coating electrically-insulating bismuth-based glass on the surface of the nickel plating layer.

PRIOR ART DOCUMENTS

Patent Documents

Patent Document 1: JP 2004-171806 A
Patent Document 2: JP 2011-97007 A
Patent Document 3: JP 2006-80370 A
Patent Document 4: JP 2014-107053 A

SUMMARY OF THE INVENTION

Problems to be Solved by the Invention

The metal substrate for flexible device is prepared by coating bismuth-based glass on a metal sheet. Since the bismuth-based glass has excellent moisture barrier property and excellent adhesion to the metal sheet, the substrate has excellent insulation and smoothness. Further, the substrate is light-weight and flexible. However, the fired surface of the glass layer may have seeding (minute protrusions) and cissing. These minute defects may impair smoothness of the glass layer.

When a stainless steel sheet that is resistant against rusting is used for the metal sheet, sufficient adhesion may not be achieved between the stainless steel sheet and the glass layer. This may degrade the bending strength and cause problems such as breaks and peeling of the glass layer.

In order to solve the problems, the present inventors proposed in WO 2018/235759 a substrate for flexible device. The substrate includes a stainless steel sheet, a nickel plating layer formed on a surface of the stainless steel sheet, and a glass layer of electrically-insulating bismuth-based glass formed in a form of layer on a surface of the nickel plating layer.

Rusting in the substrate for flexible device is prevented effectively by use of a stainless steel sheet. Furthermore, the adhesion between the stainless steel sheet and the glass layer is remarkably improved by forming a nickel plating layer on the stainless steel sheet. Since the substrate has excellent bending strength, it has sufficient flexibility free from peeling or the like of the glass layer when used as a substrate for flexible device.

The present inventors further conducted researches on the above-mentioned invention of the former application in order to simplify the manufacturing process and quality control, and reduce the manufacturing cost. As a result, they found that formation of an oxide layer having a specific thickness and composition on a stainless steel sheet can impart adhesion of glass layer of the substantially same level as a case of forming a nickel plating layer. In other words, there may be no necessity of forming a nickel plating layer.

Therefore, an object of the present invention is to provide a substrate for a flexible device, which is excellent in antirust property, moisture barrier property, adhesion of glass layer, bending strength and surface smoothness of the glass layer surface, and which may be easily manufactured and quality-controlled.

Means for Solving the Problems

The present invention provides a substrate for flexible device, and the substrate includes a stainless steel sheet, an oxide layer formed on a surface of the stainless steel sheet, and a glass layer of electrically-insulating bismuth-based glass in a form of layer formed on the surface of the oxide layer.

In the substrate for flexible device of the present invention, it is preferable that:
1. the oxide layer has a thickness of not less than 30 nm;
2. the oxide layer has a thickness of not less than 80 nm;
3. a chromium concentration at a point distanced by 20 nm in the thickness direction of the oxide layer from the interface between the oxide layer and the glass layer is not less than 30 atomic %;
4. a chromium concentration at a point distanced by 20 nm in the thickness direction of the oxide layer from the interface between the oxide layer and the glass layer is not less than 50 atomic %; and 5. the bismuth-based glass contains $Bi_2O_3$, ZnO and $B_2O_3$.

The present invention further provides a substrate for flexible device, and the substrate includes a stainless steel sheet and an oxide layer formed on a surface of the stainless steel sheet. The oxide layer has a thickness of not less than 30 nm.

In the substrate for flexible device of the present invention, it is preferable that the oxide layer has a thickness of not less than 80 nm.

Effects of the Invention

In the substrate for flexible device of the present invention, rusting can be prevented effectively by use of a stainless steel sheet. In addition, by forming a specific oxide layer on the surface of the stainless steel sheet, adhesion between the stainless steel sheet and the glass layer may be improved remarkably. Since the sheet has excellent bending strength, it possesses sufficient flexibility to prevent peeling or the like even when it is used as a substrate for flexible device.

Since there is no necessity of forming a nickel plating layer on the surface of the stainless steel sheet, the number of manufacturing steps can be reduced and the quality control before formation of the glass layer can be facilitated, resulting in excellent productivity.

Furthermore, since the substrate includes a glass layer having a dense structure for perfectly preventing moisture permeation, it is excellent also in moisture barrier property, and thus, it can be used efficiently as a substrate for organic EL.

MODE FOR CARRYING OUT THE INVENTION

Substrate for Flexible Device

The substrate for flexible device of the present invention is prepared by forming an oxide layer on a surface of a stainless steel sheet, and forming a glass layer on the surface of this oxide layer on this sheet. As a result, the oxide layer and the glass react with each other to form an adhesive layer so that the adhesion between the stainless steel sheet and the glass layer can be remarkably improved. This serves to improve the bending strength, and the substrate can be adapted to the roll-to-roll process without causing peeling of the glass layer as mentioned above.

In the substrate for flexible device of the present invention, it is considered that the oxide layer formed on the stainless steel sheet contains a high concentration of chromium, so that the oxide layer and the glass react with each other to form an adhesive layer, thereby improving the adhesion between the stainless steel sheet and the glass layer.

Figure 1:
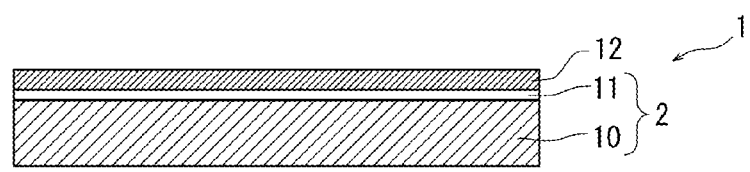
FIG. 1: a cross-sectional view showing a structure of one example of a substrate for flexible device of the present invention.

FIG. 1 is a cross-sectional view showing an example of a substrate for flexible device of the present invention. Reference numeral 1 denotes a substrate for flexible device, comprising a sheet 2 for the substrate for flexible device. This sheet 2 comprises a stainless steel sheet 10 and an oxide layer 11 formed on a surface of the stainless steel sheet 10. On the surface of the oxide layer 11, a glass layer 12 of electrically-insulating bismuth-based glass in a form of layer is formed.

Stainless Steel Sheet

Any conventionally known stainless steel materials can be used for the stainless steel sheet for the substrate for flexible device of the present invention. Among the materials, ferritic stainless steel can be used particularly preferably. It is preferable to use a material having a thermal expansion coefficient of $9.9 \times 10^{-6}$ to $21 \times 10^{-6}/°$ C., in particular, $10 \times 10^{-6}$ to $14 \times 10^{-6}/°$ C.

It is preferable that the stainless steel sheet has a thickness in a range of 10 to 200 μm, and particularly in a range of 25 to 100 μm, to obtain sufficient flexibility.

Oxide Layer

The oxide layer on the stainless steel sheet of the substrate for flexible device of the present invention is formed by firing the stainless steel sheet surface in an oxygen-containing atmosphere such as air. Therefore, the oxide layer comprises oxides of iron, chromium and other added elements, which are diffused from the stainless steel sheet.

Specifically, in the substrate for flexible device of the present invention, since the oxide layer is formed on the surface of the stainless steel sheet, the oxygen contained in the glass layer is not deprived in the process of making the glass layer adhere to the surface of the stainless steel sheet (interdiffusion) or the deprivation of the oxygen can be decreased. Therefore, substantially no oxygen shortage occurs in the glass layer. As a result, the degree of difference in composition at the interface between the glass layer and the stainless steel sheet is smaller than that in the case where the oxide layer is not formed (i.e., the stainless steel sheet surface is not fired in the oxygen-containing atmosphere), and this serves to effectively prevent degradation of adhesion.

As mentioned above, this oxide layer is formed as a chromium-rich oxide layer. Specifically, the chromium concentration at a point distanced by 20 nm in the thickness direction of the oxide layer from the interface between the oxide layer and the glass layer (i.e., Cr amount when the total amount of Cr and Fe is 100) is not less than 30 atomic %, preferably not less than 50 atomic %, further preferably not less than 70 atomic %, and still further preferably not less than 80 atomic %.

Since the chromium-rich oxide layer is formed in this manner, the adhesion between the glass layer and the stainless steel sheet is remarkably improved. While chromium oxide has an extremely high density, iron oxide is fragile in comparison with chromium oxide. As a result, since the chromium concentration on the surface of the stainless steel sheet (containing the oxide layer) increases, the probability of formation of fragile iron oxide decreases, and the adhesion between the stainless steel sheet and the glass layer will be improved.

In the present invention, it is desirable that the oxide layer has a thickness of not less than 30 nm, preferably not less than 80 nm, more preferably not less than 90 nm, and further preferably not less than 100 nm. When the oxide layer is thinner than the range, sufficient adhesion of the glass layer cannot be obtained as compared with the case where the thickness is within the range. Further, as evidently shown from the results of Examples described later, there is a possibility that sufficient bending strength cannot be obtained when bending the substrate provided with the glass layer on the outer surface.

The thicker the oxide layer, the larger the amount of chromium contained in the oxide layer, thereby improving the adhesion between the stainless steel sheet and the glass layer and improving the bending strength. However, when the thickness of the oxide layer exceeds 2000 nm, the oxide layer may weaken and the bending strength may be degraded. Therefore, the thickness of the oxide layer preferably is not more than 2000 nm, particularly not more than 1500 nm.

Glass Layer

The substrate for flexible device of the present invention comprises a glass layer formed as an insulating layer on the aforementioned oxide layer. The glass layer is of bismuth-based glass having an excellent moisture barrier property and excellent adhesion to the stainless steel sheet.

In the present invention, bismuth-based glass containing $Bi_2O_3$, ZnO and $B_2O_3$ can be preferably used. Namely, ZnO and $B_2O_3$ are contained as essential components together with $Bi_2O_3$ as the main component, and thus, these components are within the range of eutectic points. This can form a glass network structure that is hardly crystalized. By combining the glass with the aforementioned oxide layer, it is possible to provide a substrate for flexible device where cissing on the glass surface can be effectively prevented and controlled.

For the bismuth-based glass, electrically-insulating glass having a softening point in a range of 300 to 500° C. is applied preferably. Glass containing $Bi_2O_3$ as amain component (particularly not less than 70% by weight) for the glass composition is preferred. It is particularly preferable that the glass is bismuth-based non-lead glass containing 70 to 84% by weight of $Bi_2O_3$, 10 to 12% by weight of ZnO, and 6 to 12% by weight of $B_2O_3$ though the present invention is not limited to this example. When the contents of these components are within these ranges, crystallization of the glass layer is prevented or controlled, and cissing may be prevented effectively.

The bismuth-based glass contains further $SiO_2$ and/or $Al_2O_3$ in addition to the aforementioned essential components. It is preferable that the content of $SiO_2$ is 0 to 2% by weight, and the content of $Al_2O_3$ is 0 to 1% by weight. As a result of blending at least one of these components, the moisture barrier property and the like can be improved to stabilize the glass layer.

It is preferable that the bismuth-based glass contains further CuO and/or NiO in addition to the aforementioned essential components. The melting property of the glass can be improved by blending not more than 2% by weight of CuO and not more than 2% by weight of NiO.

Further, the bismuth-based glass may contain 1.5% by weight or less of any of $Y_2O_3$, $ZrO_2$, $La_2O_3$, $CeO_2$, $TiO_2$, CoO, or $Fe_2O_3$ in addition to the aforementioned essential components. These components can improve the durability of glass, though excessive blend amounts of these components may degrade the durability of the glass. These components can be used in combination of at least two thereof. In the case, the total amount is preferably not more than 1.5% by weight.

In the present invention, the glass layer has a thickness in a range of 2 to 45 μm, preferably in a range of 5 to 20 μm, and further preferably 5 to 16 μm. When the thickness of the glass layer is less than the range, sufficient insulation may not be achieved in comparison with a case where the thickness is within the range, and the roughness on the stainless steel sheet may not be smoothened sufficiently. When the thickness is greater than the range, the flexibility may be inferior in comparison with a case where the thickness is within the range.

Method for Producing Substrate for Flexible Device

The substrate for flexible device of the present invention can be produced by a method including an oxide layer forming step of forming an oxide layer on at least one surface of a stainless steel sheet; and a glass layer forming step of forming a bismuth-based glass layer on the oxide layer.

Step of Forming Oxide Layer

In the method for producing a substrate for flexible device of the present invention and also a method for producing a sheet used in production of the substrate, the stainless steel sheet is fired in an oxygen-containing atmosphere, thereby forming an oxide layer on the surface of the stainless steel sheet.

The conditions for firing are not limited particularly as long as the aforementioned oxide layer can be formed, but preferably, the temperature for firing is in a range of 200 to 1300° C., preferably 1000 to 1250° C., and further preferably 1000 to 1100° C. When the firing temperature is lower than the range, the oxide layer cannot be formed effectively in comparison with a case where the temperature is within the range. When the firing temperature is higher than the range, the stainless steel sheet may be detorted though the risk may vary depending on the thickness of the stainless steel sheet.

The firing time can be modified suitably depending on the oxygen concentration and firing temperature of the oxygen-containing atmosphere. In a case of firing in air within the aforementioned temperature range, it is preferable to fire for 10 to 500 seconds at the firing temperature.

As mentioned above, the oxide layer is formed to have a thickness of not less than 30 nm, preferably not less than 80 nm, not more than 2000 nm, and preferably not more than 1500 nm.

Step of Forming Glass Layer

Next, a bismuth-based glass layer is formed on the oxide layer.

In the step of forming the glass layer, usually a glass powder and a vehicle are mixed and dispersed to prepare glass paste. The paste is coated and dried on the oxide layer, and fired, though the procedures are not limited to this example.

Preparation of Glass Paste

In preparation of glass paste, a glass frit of the aforementioned bismuth-based glass is pulverized to form a glass powder, which is then mixed with a vehicle and dispersed.

The glass powder is obtained by mixing the glass materials, heating at a temperature in a range of 800 to 1200° C.

to form molten glass, quenching to obtain a glass frit, and then, pulverizing the glass frit. The pulverization may be conducted by any conventionally known method, and the examples include JET pulverization, rapid mill pulverization, and ball mill pulverization.

For smoothening the glass surface, the glass powder has an average particle diameter of not more than 20 µm, preferably in a range of 1 to 10 µm, and more preferably 1 to 5 µm. For obtaining the fine powder, the JET pulverization is most preferred among the aforementioned pulverization methods.

Then, the thus obtained glass powder and the vehicle are mixed and dispersed.

Examples of the mixing-dispersion method includes dispersion using a rotary mixer having a stirring blade, a beads mill, a paint shaker, a roll mill, an agate mortar, or ultrasonic waves. It is preferable that mixing and dispersing are conducted by using a beads mill, a paint shaker or a roll mill.

Known thickeners, dispersants or the like can be added as required to the glass paste according to known formulation.

The vehicle to be mixed with the glass powder so as to compose the paste is prepared by solving a binder in a solvent, and used for adjusting viscosity of the paste.

It is preferable that the glass paste contains the glass powder in an amount of 30 to 80% by weight, the binder in an amount of more than 0 and not more than 10% by weight, and the solvent in an amount of 10 to 70% by weight. When the amount of the glass powder is smaller than the range, the paste viscosity is lowered to make it difficult to form the glass layer having a desired thickness. When the amount of the glass powder is greater than the range, the paste viscosity becomes extremely high to degrade the coatability. When the amount of the binder is smaller than the range, the coatability may be degraded. When the amount of the binder is greater than the range, undecomposed residues may remain after the firing step. Further, when the amount of the solvent is smaller than the range, the paste viscosity becomes extremely high to degrade the coatability. And when the amount of the solvent is greater than the range, the paste viscosity becomes extremely low to make it difficult to form a glass layer having a desired thickness.

For the vehicle, any conventionally known solvent-based or aqueous vehicles can be used, and the examples include the following binders and solvents, though the present invention is not limited to these examples.

Examples of the binder include: cellulose-based resins such as methyl cellulose, ethyl cellulose, carboxymethyl cellulose, oxyethyl cellulose, benzyl cellulose, propyl cellulose, and nitrocellulose; organic resins like an acrylic resin obtained by polymerizing at least one acrylic monomer, such as methyl methacrylate, ethyl methacrylate, butyl methacrylate, 2-hydroxyethyl methacrylate, butyl acrylate, and 2-hydroxyethyl acrylate; and aliphatic polyolefin-based carbonate resins such as polypropylene carbonate, though the present invention is not limited to these examples.

The solvent may be selected suitably according to the binder in use. The examples include: water, terpineol, butyl carbitol acetate, ethyl carbitol acetate or the like for the cellulose-based resins; methyl ethyl ketone, terpineol, butyl carbitol acetate, ethyl carbitol acetate or the like for the acrylic resins; and propylene carbonate, triacetin or the like for the aliphatic polyolefin-based carbonate, though the present invention is not limited to these examples.

Coating, Drying and Firing of Glass Paste

The thus prepared glass paste is coated on the oxide layer by a coating method selected in accordance with the viscosity of the glass paste. The coating can be conducted by using a bar coater, a die coater, a roll coater, a gravure coater, screen printing, offset printing, an applicator or the like though the present invention is not limited to these examples.

The coated glass paste is dried at a temperature in a range of 80 to 180° C. After drying, a debinding treatment is conducted as required. Preferably, the debinding treatment is conducted by heating for 10 minutes or more at a temperature in a range of 180 to 450° C.

After drying, the coated surface that is subjected in advance to the debinding treatment as required is fired for 10 to 300 seconds at a temperature of 550 to 900° C., preferably 650 to 900° C. so as to form a glass layer. When the firing temperature is lower than this range, melting may be insufficient in comparison with a case where the temperature is within the range. When the firing temperature is higher than the range, the glass surface may be affected in comparison with a case where the temperature is within the range.

Substrate for Organic EL Device

Figure 2:
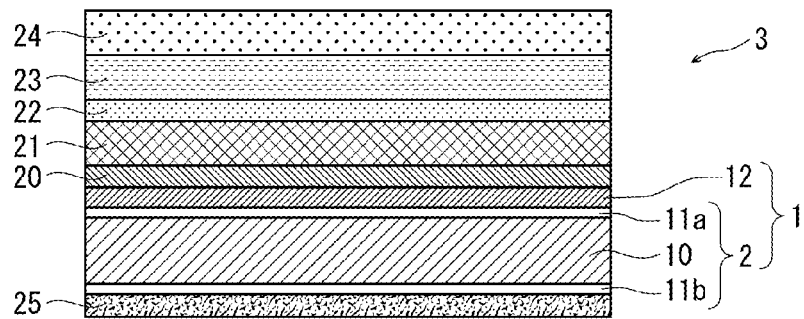
FIG. 2: a cross-sectional view showing a structure of a substrate for organic EL device, including the substrate for flexible device of the present invention shown in FIG. 1.

FIG. 2 is a cross-sectional view showing an example of a substrate for organic EL device, comprising the substrate for flexible device of the present invention shown in FIG. 1.

Reference numeral 1 denotes a substrate for flexible device, which comprises a stainless steel sheet 10 with oxide layers 11a, 11b formed on the both surfaces. On the oxide layer 11a, a glass layer 12 is formed.

Reference numeral 3 denotes a substrate for organic EL device. This substrate 3 comprises the substrate 1 for flexible device, which has at least an electrode layer (Ag, Al) 20 formed on the glass layer 12 of the substrate 1 for flexible device, an organic thin-film light-emitting layer 21 formed on the electrode layer 20, and a transparent electrode layer 22 formed on the organic thin-film light-emitting layer 21. In the specific example shown in FIG. 2, a transparent sealing layer 23 and a transparent sealing member 24 are further laminated on the transparent electrode layer 22, and a corrosion resistant layer 25 is coated on the oxide layer 11b.

It is also possible to form an underlying layer (not shown), which exhibits excellent adhesion to the electrode layer, on the glass layer 12 shown in FIG. 2.

The underlying layer can be formed from a metal or metal oxide selected from nickel (Ni), indium tin oxide (ITO), silver (Ag), gold (Au), copper (Cu), magnesium-silver (MgAg), gold-copper (AuCu), silver-copper (AgCu), zinc oxide (ZnO), cobalt (Co), or palladium (Pd) by any conventionally known method such as sputtering, vapor deposition, CVD or the like. Sputtering is particularly preferred for the film formation.

This underlying layer can exhibit excellent adhesion to every electrode layer comprising aluminum (Al), silver (Ag), gold (Au) or an alloy thereof to be used for an organic EL substrate. Particularly in a case of forming the electrode layer from aluminum (Al) or silver (Ag), the underlying layer is preferably formed from nickel or indium tin oxide among the aforementioned metals or metal oxides.

The underlying layer preferably has a thickness in a range of 5 to 100 nm.

EXAMPLES

1. Stainless Steel Sheet

Four types of stainless steel sheets having a thickness of 0.05 mm were used.

SUS430MA: ferritic stainless steel foil (manufactured by Nippon Kinzoku Co., Ltd.)

JFE443CT: ferritic stainless steel foil (manufactured by JFE Steel Corporation)

NCA-1: ferritic stainless steel foil (manufactured by Nisshin Steel Co., Ltd.)

SUS430: ferritic stainless steel foil (manufactured by Nisshin Steel Co., Ltd.)

2. Firing (Formation of Oxide Layer)

The surface of the stainless steel sheet was heated for 20 seconds under the conditions shown in Table 2.

3. Formation of Glass Layer

In a degreasing step, the surface of each specimen was wiped off with gauze soaked in alcohol for the purpose of degreasing.

In a coating formation step, a vehicle as a mixture of an organic solvent and a binder was prepared. The vehicle was mixed in a mortar with a bismuth-based glass powder described in Table 1 at a weight ratio of 25:75. The mixture was dispersed using a ceramic roll mill to produce a glass paste for coating. The glass paste was coated on the specimen by using a bar coater such that the film thickness after firing would be 10 μm. Later, the glass firing step was conducted using an electric furnace by drying (temperature: 150° C., time: 3 minutes), debinding (temperature: 330° C., time: 20 minutes) and firing (temperature: 850° C., time: 30 seconds) to form a glass layer.

TABLE 1

| Component | Composition (wt %) |
| --- | --- |
| $Bi_2O_3$ | 81.00 |
| ZnO | 10.87 |
| $B_2O_3$ | 6.21 |
| $SiO_2$ | 1.31 |
| $Al_2O_3$ | 0.47 |
| CuO | 0.14 |
| Total | 100.00 |

4. Evaluation

(1) Thickness of Oxide Layer

The thickness of each of the oxide layers of sheets for substrate for flexible device obtained in Examples and Comparative Examples was measured by using a Field Emission Auger Microscope (AES: product JAMP-9500F manufactured by JEOL).

(2) Bending Strength

The substrates for flexible devices, which were produced in Examples and Comparative Examples, were wound on cylindrical stainless steel bars each having a diameter (ϕ) of 30 mm, 20 mm or 10 mm such that the glass layer would make the outer/inner surface. These objects were observed visually to check peeling and cracks. The results are shown in Table 2.

The criteria for evaluation are as follows. Peeling and cracks caused by the winding test (visual observation)

⊚: There is no peeling from glass/sheet interface and no crack.

O: There is no peeling from glass/sheet interface while there are few cracks.

Δ: There is no peeling from glass/sheet interface but there are a few cracks.

X: There is peeling from glass/sheet interface and there are cracks.

The comprehensive evaluation is as follows.

⊚: Evaluation for "wound with glass layer arranged outside, ϕ20" is ⊚, and all evaluations for "wound with glass layer arranged inside" are ⊚.

O: Evaluation for "wound with glass layer arranged outside, ϕ30" is ⊚, evaluation for "wound with glass layer arranged outside, ϕ20" is O, and all evaluations for "wound with glass layer arranged inside" are ⊚.

Δ: Evaluations for "wound with glass layer arranged outside, ϕ30" is ⊚, evaluation for "wound with glass layer arranged outside, ϕ20" is Δ, and all evaluations for "wound with glass layer arranged inside" are ⊚.

ΔΔ: Evaluation for "wound with glass layer arranged outside, ϕ30" is O or Δ, and all evaluations for "wound with glass layer arranged inside" are ⊚.

ΔΔΔ: All evaluations for "wound with glass layer arranged outside" are X, evaluations for "wound with glass layer arranged inside, ϕ30 and ϕ20" are ⊚ or all evaluations for "wound with glass layer arranged inside" are ⊚.

X: All evaluations for "wound with glass layer arranged outside" are X, and only evaluation for "wound with glass layer arranged inside, ϕ30" is ⊚.

(3) Chromium Concentration (Depth Profile)

For the sheets for substrate for flexible device obtained in Examples 2, 4, 9-14, 21, 24, 25, 27 and Comparative Examples 1-4, the chromium (Cr) amount and iron (Fe) amount at a point distanced by 20 nm in the thickness direction of the oxide layer from the interface between the glass layer and the oxide layer were measured by X-ray photoelectron spectroscopy (XPS) analysis, and the chromium concentration was calculated through the following equation. The results are shown in Table 2.

$$\text{Cr concentration(atomic \%)} = Cr/(Cr+Fe) \times 100$$

TABLE 2-1

| | | Sheet treatment (baking condition) | | | | Surface oxide | |
| --- | --- | --- | --- | --- | --- | --- | --- |
| | Sheet | Baking | Baking atmosphere | Baking furnace | Furnace temp. (° C.) | layer thickness (nm) | Cr concentration (atomic %) |
| Example 1 | SUS430MA | Yes | Air | Continuous | 800 | 92.0 | — |
| Example 2 | SUS430MA | Yes | Air | Batch | 1000 | 95.0 | 73.5 |

TABLE 2-1-continued

|  | Sheet | Sheet treatment (baking condition) | | | | Surface oxide | |
|---|---|---|---|---|---|---|---|
|  |  | Baking | Baking atmosphere | Baking furnace | Furnace temp. (° C.) | layer thickness (nm) | Cr concentration (atomic %) |
| Example 3 | SUS430MA | Yes | Air | Continuous | 900 | 119 | — |
| Example 4 | SUS430MA | Yes | Air | Batch | 1100 | 121 | 87.1 |
| Example 5 | SUS430MA | Yes | Air | Continuous | 950 | 133 | — |
| Example 6 | SUS430MA | Yes | Air | Continuous | 1000 | 172 | — |
| Example 7 | SUS430MA | Yes | Air | Continuous | 1050 | 260 | — |
| Example 8 | SUS430MA | Yes | Air | Continuous | 1080 | 312 | — |
| Example 9 | JFE443CT | Yes | Air | Batch | 1000 | 80.0 | 77.3 |
| Example 10 | JFE443CT | Yes | Air | Batch | 1100 | 146 | 92.3 |
| Example 11 | NCA-1 | Yes | Air | Batch | 1000 | 103 | 78.8 |
| Example 12 | NCA-1 | Yes | Air | Batch | 1100 | 180 | 57.4 |
| Example 13 | SUS430 | Yes | Air | Batch | 1000 | 108 | 74.0 |
| Example 14 | SUS430 | Yes | Air | Batch | 1100 | 186 | 91.2 |
| Example 15 | SUS430MA | Yes | Air | Batch | 1250 | 1500 | — |
| Example 16 | SUS430MA | Yes | Air | Batch | 1300 | 2000 | — |
| Example 17 | SUS430MA | Yes | Air | Batch | 500 | 30.0 | — |
| Example 18 | SUS430MA | Yes | Air | Batch | 600 | 37.2 | — |
| Example 19 | SUS430MA | Yes | Air | Continuous | 500 | 45.6 | — |
| Example 20 | SUS430MA | Yes | Air | Continuous | 600 | 60.0 | — |
| Example 21 | SUS430MA | Yes | Air | Batch | 800 | 60.0 | 43.5 |
| Example 22 | SUS430MA | Yes | Air | Batch | 950 | 64.0 | — |
| Example 23 | SUS430MA | Yes | Air | Continuous | 700 | 71.0 | — |
| Example 24 | JFE443CT | Yes | Air | Batch | 800 | 53.0 | 61.8 |
| Example 25 | NCA-1 | Yes | Air | Batch | 800 | 51.0 | 41.2 |
| Example 26 | NCA-1 | Yes | Air | Batch | 950 | 79.0 | — |
| Example 27 | SUS430 | Yes | Air | Batch | 800 | 68.0 | 36.7 |
| Example 28 | SUS430 | Yes | Air | Batch | 950 | 70.0 | — |
| Comparative Example 1 | SUS430MA | No | — | — | — | 8.6 | 20.5 |
| Comparative Example 2 | JFE443CT | No | — | — | — | 23.0 | 26.2 |
| Comparative Example 3 | NCA-1 | No | — | — | — | 26.0 | 23.8 |
| Comparative Example 4 | SUS430 | No | — | — | — | 9.6 | 16.9 |
| Comparative Example 5 | SUS430MA | Yes | ArH$_2$ | Continuous | 1000 | 24.6 | — |

Note:
In Table 2, 'Continuous' and 'Batch' respectively indicate 'Continuous annealing furnace' and 'Batch annealing furnace'

TABLE 2-2

|  | Glass layer thickness (μm) | Bending strength | | | | | | Comprehensive evaluation on bending strength |
|---|---|---|---|---|---|---|---|---|
|  |  | Wound with glass layer arranged outside | | | Wound with glass layer arranged inside | | | |
|  |  | (φ)30 | (φ)20 | (φ)10 | (φ)30 | (φ)20 | (φ)10 |  |
| Example 1 | 9.7 | ⊚ | ○ | △ | ⊚ | ⊚ | ⊚ | ○ |
| Example 2 | 8.3 | ⊚ | ⊚ | ○ | ⊚ | ⊚ | ⊚ | ⊚ |
| Example 3 | 11.7 | ⊚ | ○ | △ | ⊚ | ⊚ | ⊚ | ○ |
| Example 4 | 10.0 | ⊚ | ⊚ | ○ | ⊚ | ⊚ | ⊚ | ⊚ |
| Example 5 | 15.0 | ⊚ | ○ | △ | ⊚ | ⊚ | ⊚ | ○ |
| Example 6 | 7.3 | ⊚ | ⊚ | ○ | ⊚ | ⊚ | ⊚ | ⊚ |
| Example 7 | 7.7 | ⊚ | ⊚ | ○ | ⊚ | ⊚ | ⊚ | ⊚ |
| Example 8 | 8.0 | ⊚ | ⊚ | ○ | ⊚ | ⊚ | ⊚ | ⊚ |
| Example 9 | 11.0 | ⊚ | ⊚ | △ | ⊚ | ⊚ | ⊚ | ⊚ |
| Example 10 | 9.3 | ⊚ | ⊚ | ○ | ⊚ | ⊚ | ⊚ | ⊚ |
| Example 11 | 7.7 | ⊚ | ⊚ | ○ | ⊚ | ⊚ | ⊚ | ⊚ |
| Example 12 | 8.0 | ⊚ | ⊚ | ○ | ⊚ | ⊚ | ⊚ | ⊚ |
| Example 13 | 8.0 | ⊚ | ○ | △ | ⊚ | ⊚ | ⊚ | ○ |
| Example 14 | 8.0 | ⊚ | ⊚ | ○ | ⊚ | ⊚ | ⊚ | ⊚ |
| Example 15 | 16.0 | ⊚ | ⊚ | ⊚ | ⊚ | ⊚ | ⊚ | ⊚ |
| Example 16 | 11.0 | ⊚ | △ | △ | ⊚ | ⊚ | ⊚ | △ |
| Example 17 | 10.0 | X | X | X | ⊚ | ⊚ | X | △△△ |
| Example 18 | 9.3 | X | X | X | ⊚ | ⊚ | ⊚ | △△△ |
| Example 19 | 9.7 | △ | X | X | ⊚ | ⊚ | ⊚ | △△ |
| Example 20 | 8.7 | △ | X | X | ⊚ | ⊚ | ⊚ | △△ |

TABLE 2-2-continued

|  | Glass layer thickness (μm) | Bending strength | | | | | | Comprehensive evaluation on bending strength |
|---|---|---|---|---|---|---|---|---|
|  |  | Wound with glass layer arranged outside | | | Wound with glass layer arranged inside | | |  |
|  |  | (φ)30 | (φ)20 | (φ)10 | (φ)30 | (φ)20 | (φ)10 |  |
| Example 21 | 9.7 | △ | X | X | ⊚ | ⊚ | ⊚ | △△ |
| Example 22 | 10.0 | ⊚ | △ | △ | ⊚ | ⊚ | ⊚ | △ |
| Example 23 | 9.0 | ⊚ | △ | △ | ⊚ | ⊚ | ⊚ | △ |
| Example 24 | 11.7 | ○ | △ | X | ⊚ | ⊚ | ⊚ | △△ |
| Example 25 | 8.7 | ○ | △ | △ | ⊚ | ⊚ | ⊚ | △△ |
| Example 26 | 10.0 | ⊚ | △ | △ | ⊚ | ⊚ | ⊚ | △ |
| Example 27 | 8.0 | △ | X | X | ⊚ | ⊚ | ⊚ | △△ |
| Example 28 | 10.0 | ○ | △ | △ | ⊚ | ⊚ | ⊚ | △△ |
| Comparative Example 1 | 10.7 | X | X | X | ⊚ | X | X | X |
| Comparative Example 2 | 10.0 | X | X | X | ⊚ | △ | X | X |
| Comparative Example 3 | 9.0 | X | X | X | ⊚ | X | X | X |
| Comparative Example 4 | 8.3 | X | X | X | ⊚ | X | X | X |
| Comparative Example 5 | 9.7 | X | X | X | ⊚ | X | X | X |

INDUSTRIAL APPLICABILITY

The substrate for flexible device of the present invention is excellent in antirust property, moisture barrier property, insulation, bending strength, and surface smoothness and adhesion of the glass layer. It can be suitably used as a substrate for organic EL lighting, organic EL displays, organic thin-film solar cells, IC print circuits, electronic paper and the like.

EXPLANATIONS OF LETTERS OR NUMERALS

1: substrate for flexible device
10: stainless steel sheet
11: oxide layer
12: glass layer
20: electrode layer (Ag, Al)
21: organic thin-film light-emitting layer
22: transparent electrode layer
23: transparent sealing layer
24: transparent sealing member
25: corrosion resistant layer

The invention claimed is:

1. A substrate for flexible device, including a stainless steel sheet, an oxide layer on a surface of the stainless steel sheet, and a glass layer of electrically-insulating bismuth-based glass in a form of layer on a surface of the oxide layer, wherein a chromium concentration at a point distanced by 20 nm in a thickness direction of the oxide layer from an interface between the oxide layer and the glass layer is not less than 30 atomic %.

2. The substrate for flexible device according to claim 1, wherein the oxide layer has a thickness of not less than 30 nm.

3. The substrate for flexible device according to claim 1, wherein the oxide layer has a thickness of not less than 80 nm.

4. The substrate for flexible device according to claim 1, wherein the chromium concentration at the point distanced by 20 nm in the thickness direction of the oxide layer from the interface between the oxide layer and the glass layer is not less than 50 atomic %.

5. The substrate for flexible device according to claim 1, wherein the bismuth-based glass contains $Bi_2O_3$, ZnO and $B_2O_3$.

* * * * *